United States Patent
Park et al.

(10) Patent No.: US 8,114,303 B2
(45) Date of Patent: Feb. 14, 2012

(54) METHOD OF MANUFACTURING CERAMIC PROBE CARD

(75) Inventors: Ho Joon Park, Seoul (KR); Byeung Gyu Chang, Gyunggi-do (KR); Hee Ju Son, Gyunggi-do (KR); Sang Jin Kim, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 370 days.

(21) Appl. No.: 12/397,923

(22) Filed: Mar. 4, 2009

(65) Prior Publication Data

US 2010/0032407 A1    Feb. 11, 2010

(30) Foreign Application Priority Data

Aug. 5, 2008  (KR) ................. 10-2008-0076530

(51) Int. Cl.
*H01B 13/00*  (2006.01)
(52) U.S. Cl. .......................... 216/13; 438/15
(58) Field of Classification Search .............. None
See application file for complete search history.

(56) References Cited

U.S. PATENT DOCUMENTS

| | | | | |
|---|---|---|---|---|
| 6,004,705 A | * | 12/1999 | Masaki et al. | 430/15 |
| 6,255,126 B1 | * | 7/2001 | Mathieu et al. | 438/15 |
| 2004/0249040 A1 | * | 12/2004 | Yamashiki et al. | 524/418 |

FOREIGN PATENT DOCUMENTS

| | | |
|---|---|---|
| KR | 10-2006-0027423 A | 3/2006 |
| KR | 10-2008-0024236 | 3/2008 |
| WO | WO 00/33089 | 6/2000 |
| WO | WO0033089 * | 6/2000 |

OTHER PUBLICATIONS

Korean Office Action, with English Translation, issued in Korean Patent Application No. 10-2008-0076530, dated Dec. 14, 2010.

* cited by examiner

*Primary Examiner* — Binh X Tran
*Assistant Examiner* — David Cathey, Jr.
(74) *Attorney, Agent, or Firm* — McDermott Will & Emery LLP

(57) ABSTRACT

Provided is a method of manufacturing a ceramic probe card. A ceramic laminated body having a plurality of ceramic green sheets and an interlayer circuit including a conductive via and a conductive line formed in the plurality of ceramic green sheets is prepared. Then, at least one probe pin structure connected to the interlayer circuit is formed by selectively removing the plurality of photosensitive ceramic sheets having a ceramic powder and a photosensitive organic component on the ceramic laminated body necessarily, and by filling a metal material in a region from which the plurality of photosensitive ceramic sheets have been removed. Then, a ceramic substrate having the at least one probe pin structure is provided by simultaneously firing the ceramic laminated body and the photosensitive ceramic sheets, and by removing the photosensitive ceramic sheets.

12 Claims, 4 Drawing Sheets

METHOD OF MANUFACTURING CERAMIC PROBE CARD

CROSS-REFERENCE TO RELATED APPLICATIONS

This application claims the priority of Korean Patent Application No. 2008-0076530 filed on Aug. 5, 2008, in the Korean Intellectual Property Office, the disclosure of which is incorporated herein by reference.

BACKGROUND OF THE INVENTION

1. Field of the Invention

The present invention relates to a method of manufacturing a ceramic probe card, and more particularly, to a method of manufacturing a ceramic probe card, which is capable of preventing damages of a probe pin structure.

2. Description of the Related Art

Generally, a semiconductor test apparatus includes a tester, a performance board, a probe card, a chuck, and a prober to test electrical properties of chips on a wafer. The probe card of the semiconductor test apparatus receives a signal generated at the tester through the performance board, delivers the signal to pads of the chips in the wafer, and delivers a signal outputted from the pads of the chips to the tester through the performance board.

A related art probe card is manufactured by forming a probe pin on a silicon substrate and bonding the probe pin onto a ceramic substrate. Concretely, a metal material is deposited or plated on the silicon substrate to form a probe pin structure. The probe pin is bonded to a bump formed on the ceramic substrate. In this case, a temperature of approximately 300° C. is applied for an eutectic bonding. However, the probe pin may be damaged by a difference of thermal expansion coefficient between the silicon substrate and the ceramic substrate during the bonding process.

Although the probe pin is not damaged, the probe pin may be separated from the ceramic substrate because the bonding strength between the ceramic substrate and the probe pin is weak.

SUMMARY OF THE INVENTION

An aspect of the present invention provides a method of manufacturing a ceramic probe card capable of enhancing reliability of a probe pin structure, by forming the probe pin structure on a ceramic laminated body using a plurality of photosensitive ceramic sheets having a relatively small difference of a thermal expansion coefficient compared to the ceramic laminated body.

An aspect of the present invention provides a method of manufacturing a ceramic probe card capable of increasing a bonding strength between a probe pin structure and a ceramic laminate body by simultaneously firing a ceramic laminated body and a plurality of photosensitive ceramic sheets.

According to an aspect of the present invention, there is provided a method of manufacturing a ceramic probe card, the method including: preparing a ceramic laminated body having a plurality of ceramic green sheets and an interlayer circuit including a conductive via and a conductive line formed in the plurality of ceramic green sheets; forming at least one probe pin structure connected to the interlayer circuit by selectively removing the plurality of photosensitive ceramic sheets having a ceramic powder and a photosensitive organic component on the ceramic laminated body necessarily, and by filling a metal material in a region from which the plurality of photosensitive ceramic sheets have been removed; and providing a ceramic substrate having the at least one probe pin structure by simultaneously firing the ceramic laminated body and the photosensitive ceramic sheets, and by removing the photosensitive ceramic sheets.

The at least one probe pin structure may include a bonding part formed on top surface of the ceramic substrate to be connected to the interlayer circuit of the ceramic laminated body, and a probe beam having one end connected on the bonding part and the other end including a probe tip formed thereon.

The forming of the at least one probe pin structure may include: forming a first photosensitive ceramic sheet on the ceramic laminated body; selectively removing the first photosensitive ceramic sheet to form a space corresponding to the bonding part; forming the bonding part by filling a metal material in a region from which the first photosensitive ceramic sheet has been removed forming a second photosensitive ceramic sheet on the first photosensitive ceramic sheet; selectively removing the second photosensitive ceramic sheet to form a space corresponding to the probe beam; forming the probe beam by filling a metal material in a region from which the second photosensitive ceramic sheet has been removed; forming a third photosensitive ceramic sheet on the second photosensitive ceramic sheet; selectively removing the third photosensitive ceramic sheet to form a space corresponding to the probe tip; and forming the probe tip by filling a metal material in a region from which the third photosensitive ceramic sheet has been removed.

The forming of the bonding part may include: forming a plating seed layer in the region from which the first photosensitive ceramic sheet has been removed; and forming a plating layer provided to the bonding part on the plating seed layer.

The forming of the probe beam may include: forming a plating seed layer in the region from which the second photosensitive ceramic sheet has been removed; and forming a plating layer provided to the probe beam on the plating seed layer.

The forming of the probe tip may include: forming a plating seed layer in the region from which the third photosensitive ceramic sheet has been removed; and forming a plating layer provided to the probe tip on the plating seed layer.

The forming of the plating seed layer may be performed by a sputtering process.

The selective removing of the first to third photosensitive ceramic sheets may be performed by a photolithography.

The photosensitive organic component may include a photosensitive monomer, an oligomer or a polymer polymerized with compositions containing the photosensitive monomer, or an ultraviolet absorber.

A difference of thermal expansion coefficient between the ceramic green sheet and the photosensitive ceramic sheet may be smaller than approximately 1.5 ppm/° C.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIG. 1 and FIGS. 2A to 2I are diagrams illustrating a method of manufacturing a ceramic probe card according to an embodiment of the present invention. FIG. 3 is a diagram illustrating a ceramic probe card manufactured by the method as described in FIG. 1 and FIGS. 2A to 2I.

Figure 1:
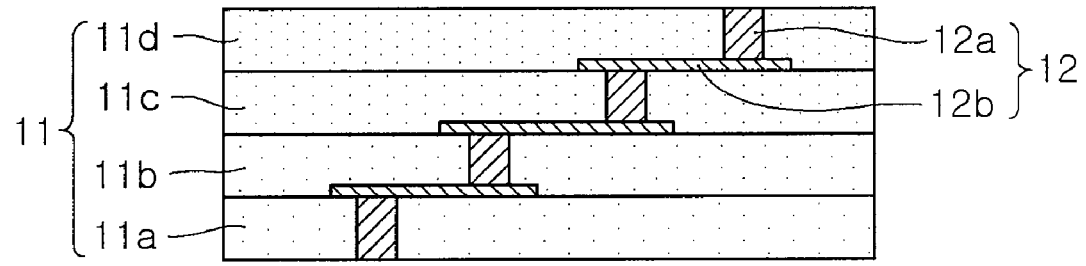
FIG. 1 is a diagram illustrating a ceramic laminated body according to an embodiment of the present invention.

FIG. 1 is a diagram illustrating a ceramic laminated body according to an embodiment of the present invention.

Referring to FIG. 1, a ceramic laminated body 11 is manufactured by laminating first to fourth ceramic green sheets 11a, 11b, 11c and 11d. In this case, the first to fourth ceramic green sheets 11a, 11b, 11c and 11d include an interlayer circuit 12 having a conductive via 12a and a conductive line 12b.

The first to fourth ceramic green sheets 11a, 11b, 11c and 11d may be manufactured using an organic material such as an organic binder, and a low temperature sinterable glass-ceramic powder. The conductive via 12a may be formed by filling a conductive paste in via holes (not shown) in the first to fourth ceramic green sheets 11a, 11b, 11c and 11d. The conductive line 12b may be formed by printing the conductive paste on the upper part of each ceramic green sheet.

For a convenient explanation, four ceramic green sheets are laminated to manufacture the ceramic laminated body 11, but not limited thereto. If necessary, the number of ceramic green sheets may be easily modified.

FIGS. 2A to 2I are diagrams illustrating a method of manufacturing a probe pin structure according to an embodiment of the present invention. More concretely, the probe pin structure including a bonding part, a probe beam, and a probe tip may be formed through processes as described in FIGS. 2A to 2I.

Figure 2A:
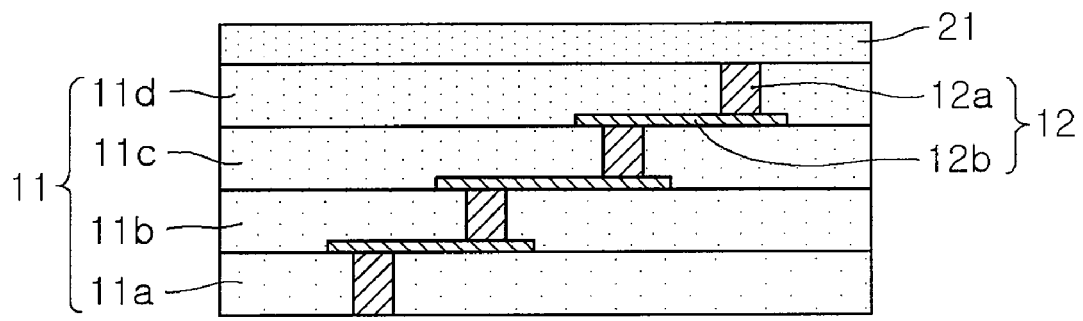
FIGS. 2A to 2I are diagrams illustrating a method of manufacturing a probe pin structure according to an embodiment of the present invention.
Figure 3:
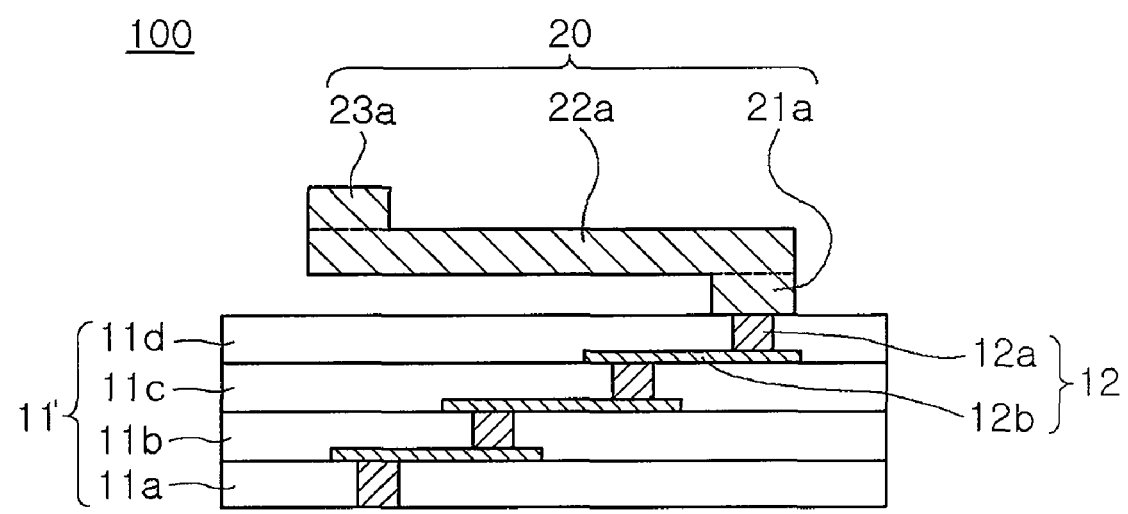
FIG. 3 is a diagram illustrating a ceramic probe card manufactured by a method according to an embodiment of the present invention.

Referring to FIG. 2A, a first photosensitive ceramic sheet 21 is formed on a ceramic laminated body 11. In this case, the first photosensitive ceramic sheet 21 necessarily includes a photosensitive organic component and a ceramic powder. More concretely, the photosensitive organic component may include a photosensitive monomer, an oligomer or a polymer polymerized using a compound containing the photosensitive monomer, or an ultraviolet absorber.

The ceramic powder may include a glass component. The ceramic powder may include one of $Al_2O_3$, $ZrO_2$ and MgO. However, concrete material of the ceramic powder will not be limited thereto. The ceramic power included in the first photosensitive ceramic sheet 21 may be identical to the ceramic powder included in the ceramic laminated body 11.

The thermal expansion coefficient of the first photosensitive sheet 21 may be similar to the ceramic laminated body 11 because the first photosensitive sheet 21 includes the ceramic powder identical to that of the ceramic laminated body 11. More concretely, the thermal expansion coefficient of the ceramic laminated body 11 including the ceramic powder (e.g., $Al_2O_3$) is approximately 5.4 to approximately 5.6 ppm/° C. The thermal expansion coefficient of the first photosensitive ceramic sheet according to an embodiment of the present invention is approximately 5.0 to approximately 5.4 ppm/° C. Accordingly, a difference of the thermal expansion coefficient between the ceramic laminated body 11 and the first photosensitive ceramic sheet 21 is approximately 0.2 to approximately 0.4 ppm/° C. Thus, a variation of thermal expansion is similar to each other. In this case, in order to regulate the thermal expansion coefficient of the first photosensitive ceramic sheet 21, each proportion of the photosensitive organic component and the ceramic powder may be appropriately modified.

Figure 2B:
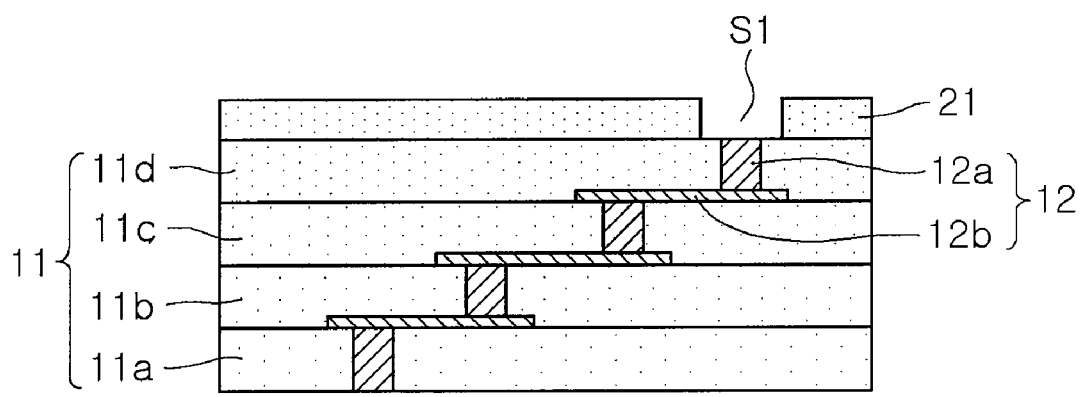

Referring to FIG. 2B, in order to form a space S1 corresponding to the bonding part constituting the probe pin structure, the first photosensitive ceramic sheet 21 is selectively removed. More concretely, the space S1 corresponding to the bonding part may be formed by exposing and developing a photo mask having a predetermined pattern on the first photosensitive ceramic sheet 21. In this case, the interlayer circuit 12 of the ceramic laminated body 11 may be exposed through the space S1 formed in the first photosensitive ceramic sheet 21.

Figure 2C:
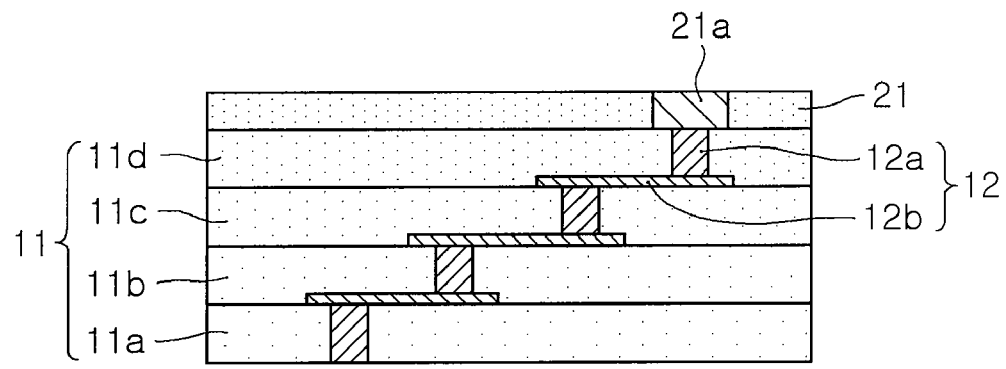

Referring to FIG. 2C, a bonding part 21a may be formed by filling a metal material in the space S1 formed in the first photosensitive ceramic sheet 21. In this case, before the filling of the metal material, a plating seed layer (not shown) may be formed of at least one of Cu, Pt, Pd, Ni, Ag, and Au in order to easily fill the metal material in the space S1.

Figure 2D:
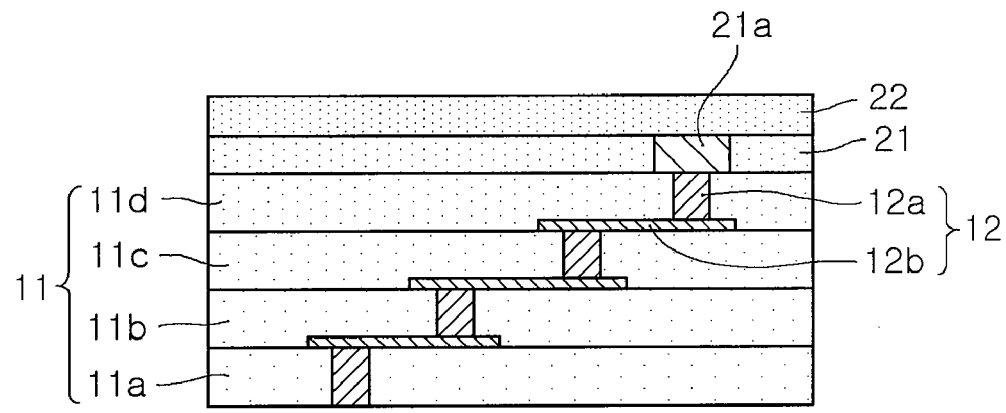

Referring to FIG. 2D, a second photosensitive ceramic sheet 22 is formed on the first photosensitive ceramic sheet 21. The second photosensitive ceramic sheet 22 may include the same material component as the first photosensitive ceramic sheet 21.

Figure 2E:
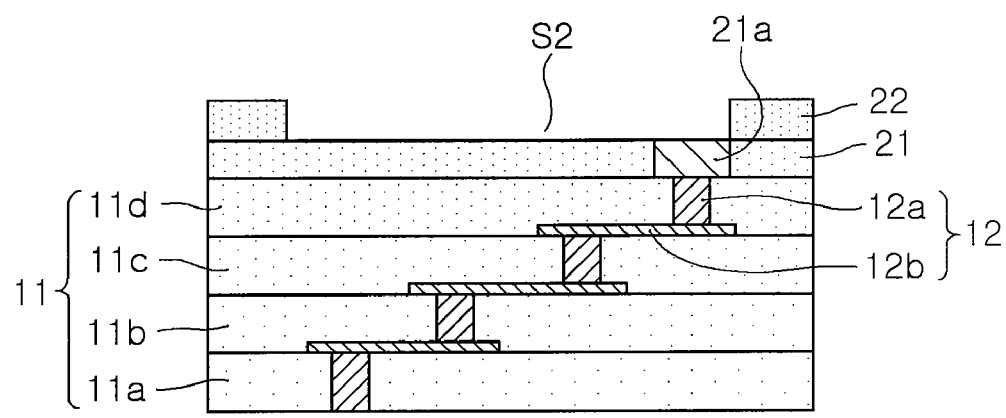

Referring to FIG. 2E, in order to form a space S2 corresponding to the probe beam constituting the probe pin structure, the second photosensitive ceramic sheet 22 is selectively removed. More concretely, the space S2 corresponding to the probe beam may be formed by exposing and developing a photo mask having a predetermined pattern on the second photosensitive ceramic sheet 22. In this case, the bonding part 21a may be exposed through the space S2 formed in the second photosensitive ceramic sheet 22.

Figure 2F:
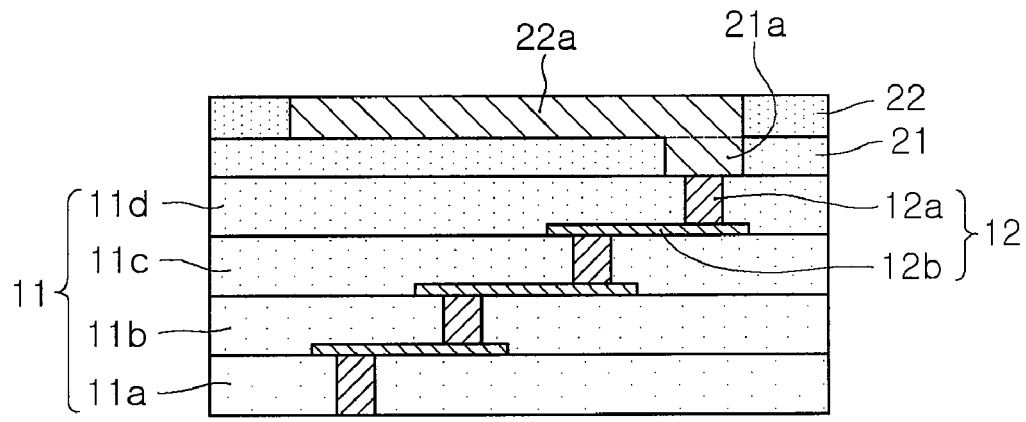

Referring to FIG. 2F, the probe beam 22a may be formed by filling a metal material in the space S2 formed in the second photosensitive ceramic sheet 22. In this case, before the filling of the metal material, a plating seed layer (not shown) may be formed in order to easily fill the metal material in the space S2.

Figure 2G:
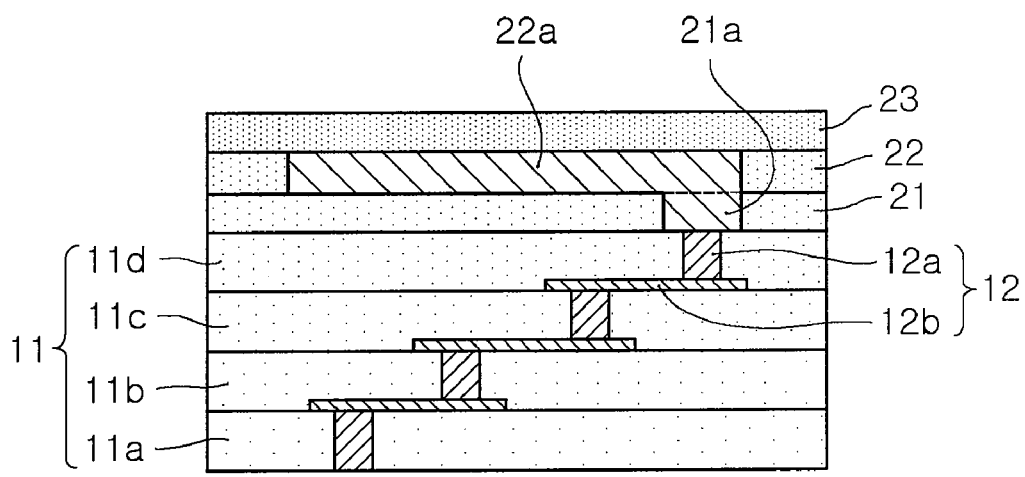

Referring to FIG. 2G, a third photosensitive ceramic sheet 23 is formed on the second photosensitive ceramic sheet 22. The third photosensitive ceramic sheet 23 may also include the same material component as the first photosensitive ceramic sheet 21.

Figure 2H:
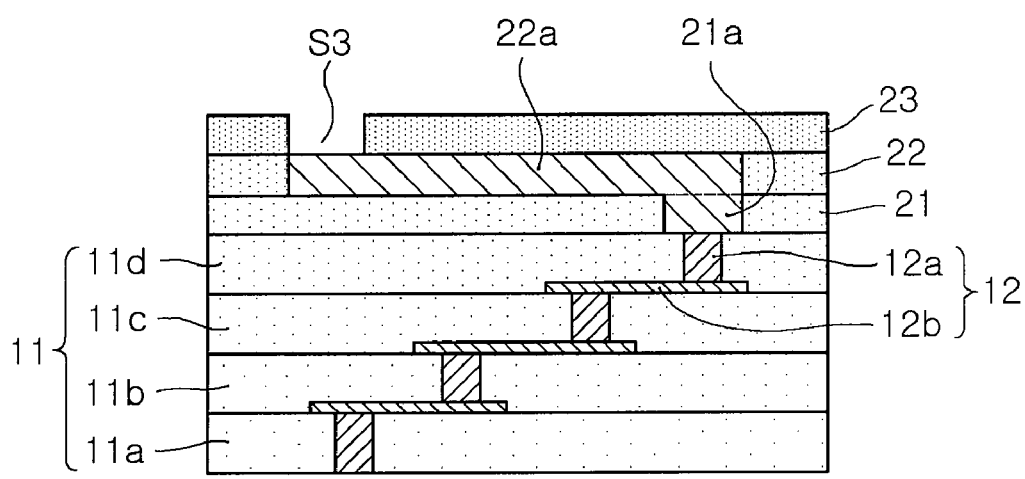

Referring to FIG. 2H, in order to form a space S3 corresponding to the probe tip constituting the probe pin structure, the third photosensitive ceramic sheet 23 is selectively removed. More concretely, the space S3 corresponding to the probe tip may be formed by exposing and developing a photo mask having a predetermined pattern on the third photosensitive ceramic sheet 23. In this case, a part of the probe beam 22a may be exposed through the space S3 formed in the third photosensitive ceramic sheet 23.

Figure 2I:
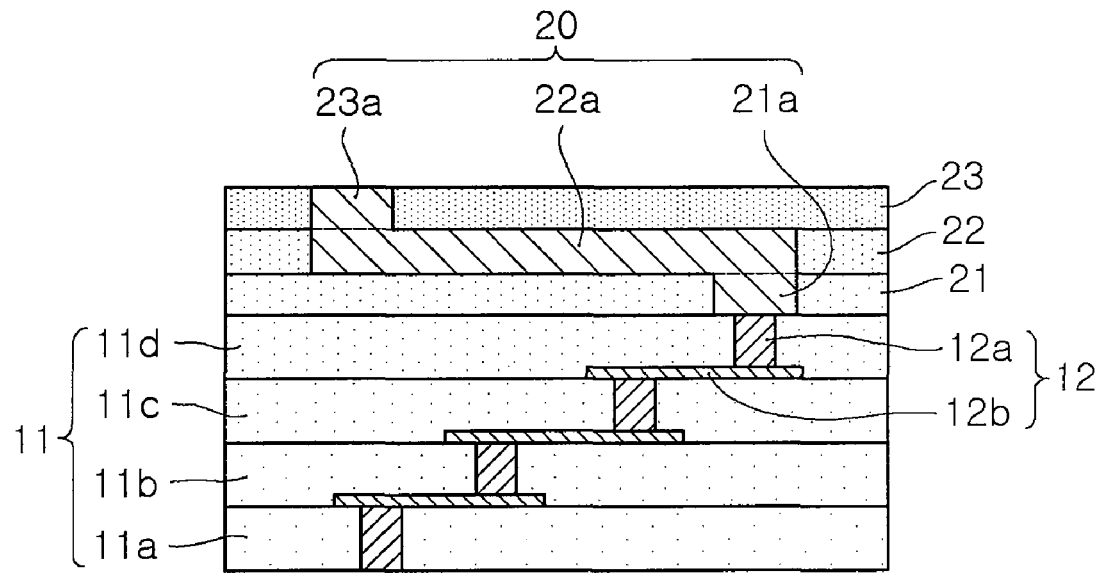

Referring to FIG. 2I, the probe tip 23a may be formed by filling a metal material in the space S3 formed in the third photosensitive ceramic sheet 23. In this case, before the filling of the metal material, a plating seed layer (not shown) may be formed in order to easily fill the metal material in the space S3.

In FIGS. 2A to 2I, the metal materials filled in the spaces S1, S2 and S3 of the first to third photosensitive ceramic sheets 21, 22 and 23 may be identical to each other. That is, the bonding part 21a, the probe beam 22a, and the probe tip 23a constituting the probe pin may be formed of the same material.

In order to fill the metal material in the spaces S1, S2 and S3 of the first to third photosensitive ceramic sheets 21, 22 and 23, a method of plating metal material or a method of filling metal material manufactured into a paste type may be used. In the latter method, a process of forming a plating seed layer may be omitted.

The ceramic laminated body 11 and the first to third photosensitive ceramic sheets 21, 22 and 23 are simultaneously fired at a temperature of approximately 800° C. to approximately 900° C. Then, the fired first to third photosensitive ceramic sheets 21, 22 and 23 are removed to form a ceramic probe card 100 where the probe pin structure 20 is formed on a ceramic substrate 11. In this case, NaOH solution may be used in order to remove the first to third photosensitive ceramic sheets 21, 22 and 23.

In the ceramic probe card 100 as describe in FIG. 3, the probe pin structure 20 may be bonded to the ceramic substrate 11' by simultaneously firing the ceramic substrate 11' and the first to third photosensitive ceramic sheets 21, 22 and 23 having similar thermal expansion coefficients, respectively. Accordingly, damages of the probe pin structure caused by a difference of the thermal expansion coefficient can be prevented during the bonding process.

Also, a bonding strength between the ceramic substrate 11' and the probe pin 20 can increase because the ceramic substrate 11' and the first to third photosensitive ceramic sheets 21, 22 and 23 are simultaneously fired.

According to the embodiments of the present invention, the probe pin structure is formed on a ceramic laminated body using a plurality of photosensitive ceramic sheets having a relatively small difference of a thermal expansion coefficient compared to the ceramic laminated body. Accordingly, when the probe pin is bonded to the ceramic laminated body, damages of the probe pin structure can be prevented, thereby enhancing the reliability of the probe pin structure.

Also, the bonding strength between a probe pin structure and a ceramic laminate body can be improved by simultaneously firing a ceramic laminated body and a plurality of photosensitive ceramic sheets. Accordingly, it is possible to enhance the reliability of the ceramic probe substrate.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a ceramic probe card, the method comprising:
   preparing a ceramic laminated body comprising a plurality of ceramic green sheets, said ceramic green sheets comprising ceramic powder, and an interlayer circuit comprising a conductive via and a conductive line formed in the plurality of ceramic green sheets;
   forming at least one probe pin structure connected to the interlayer circuit by forming a plurality of photosensitive ceramic sheets necessarily comprising ceramic powder identical to the ceramic powder comprised in the ceramic green sheets and a photosensitive organic component on the ceramic laminated body, selectively removing the plurality of photosensitive ceramic sheets, and by filling a metal material in a region from which the plurality of photosensitive ceramic sheets have been removed; and
   providing a ceramic substrate comprising the at least one probe pin structure by simultaneously firing the ceramic laminated body and the photosensitive ceramic sheets, and by removing the photosensitive ceramic sheets.

2. The method of claim 1, wherein the at least one probe pin structure comprises:
   a bonding part formed on a top surface of the ceramic substrate to be connected to the interlayer circuit of the ceramic laminated body; and
   a probe beam having one end connected on the bonding part and the other end comprising a probe tip formed thereon.

3. The method of claim 2, wherein the forming of the at least one probe pin structure comprises:
   forming a first photosensitive ceramic sheet on the ceramic laminated body;
   selectively removing the first photosensitive ceramic sheet to form a space corresponding to the bonding part;
   forming the bonding part by filling a metal material in a region from which the first photosensitive ceramic sheet has been removed forming a second photosensitive ceramic sheet on the first photosensitive ceramic sheet;
   selectively removing the second photosensitive ceramic sheet to form a space corresponding to the probe beam;
   forming the probe beam by filling a metal material in a region from which the second photosensitive ceramic sheet has been removed;
   forming a third photosensitive ceramic sheet on the second photosensitive ceramic sheet;
   selectively removing the third photosensitive ceramic sheet to form a space corresponding to the probe tip; and
   forming the probe tip by filling a metal material in a region from which the third photosensitive ceramic sheet has been removed.

4. The method of claim 3, wherein the forming of the bonding part comprises:
   forming a plating seed layer in the region from which the first photosensitive ceramic sheet has been removed; and
   forming a plating layer provided to the bonding part on the plating seed layer.

5. The method claim 3, wherein the forming of the probe beam comprises:
   forming a plating seed layer in the region from which the second photosensitive ceramic sheet has been removed; and
   forming a plating layer provided to the probe beam on the plating seed layer.

6. The method claim 3, wherein the forming of the probe tip comprises:
   forming a plating seed layer in the region from which the third photosensitive ceramic sheet has been removed; and
   forming a plating layer provided to the probe tip on the plating seed layer.

7. The method of claim 4, wherein the forming of the plating seed layer is performed by a sputtering process.

8. The method of claim 5, wherein the forming of the plating seed layer is performed by a sputtering process.

9. The method of claim 6, wherein the forming of the plating seed layer is performed by a sputtering process.

10. The method of claim 3, wherein the selective removing of the first to third photosensitive ceramic sheets is performed by a photolithography.

11. The method of claim 1, wherein the photosensitive organic component comprises a photosensitive monomer, an oligomer or a polymer polymerized with compositions containing the photosensitive monomer, or an ultraviolet absorber.

12. The method of claim 1, wherein a difference of thermal expansion coefficient between the ceramic green sheet sheets and the photosensitive ceramic sheets is smaller than approximately 1.5 ppm/° C.

* * * * *